United States Patent [19]
Morgan

[11] Patent Number: 5,898,343
[45] Date of Patent: Apr. 27, 1999

[54] VOLTAGE AND TEMPERATURE COMPENSATED RING OSCILLATOR FOR A MEMORY DEVICE

[75] Inventor: Donald M. Morgan, Boise, Id.

[73] Assignee: Micron Technology, Inc., Boise, Id.

[21] Appl. No.: 08/982,197

[22] Filed: Dec. 1, 1997

Related U.S. Application Data

[63] Continuation of application No. 08/634,269, Apr. 18, 1996, Pat. No. 5,694,090.
[51] Int. Cl.$^6$ .................. H03B 5/04; G11C 7/00
[52] U.S. Cl. ................ 331/57; 331/176; 365/222
[58] Field of Search .................. 365/222; 331/57, 331/176

[56] References Cited

U.S. PATENT DOCUMENTS

| | | |
|---|---|---|
| 5,072,197 | 12/1991 | Anderson ............... 331/57 |
| 5,180,995 | 1/1993 | Hayashi et al. ............... 331/57 |
| 5,352,945 | 10/1994 | Casper et al. ............... 307/603 |
| 5,544,120 | 8/1996 | Kuwagata et al. ............... 365/222 |

*Primary Examiner*—Siegfried H. Grimm
*Attorney, Agent, or Firm*—Schwegman, Lundberg, Woessner & Kluth, P.A.

[57] ABSTRACT

A refresh circuit of a memory device includes a ring oscillator with a frequency stabilizing circuit. The frequency stabilizing circuit produces compensated voltage signals in response to changes in supply voltage and temperature to modify the conductances of field-effect transistors of the frequency stabilizing circuit to compensate the conductive path of the discharge current of a capacitor from the ring oscillator in order to stabilize the oscillation frequency.

13 Claims, 4 Drawing Sheets

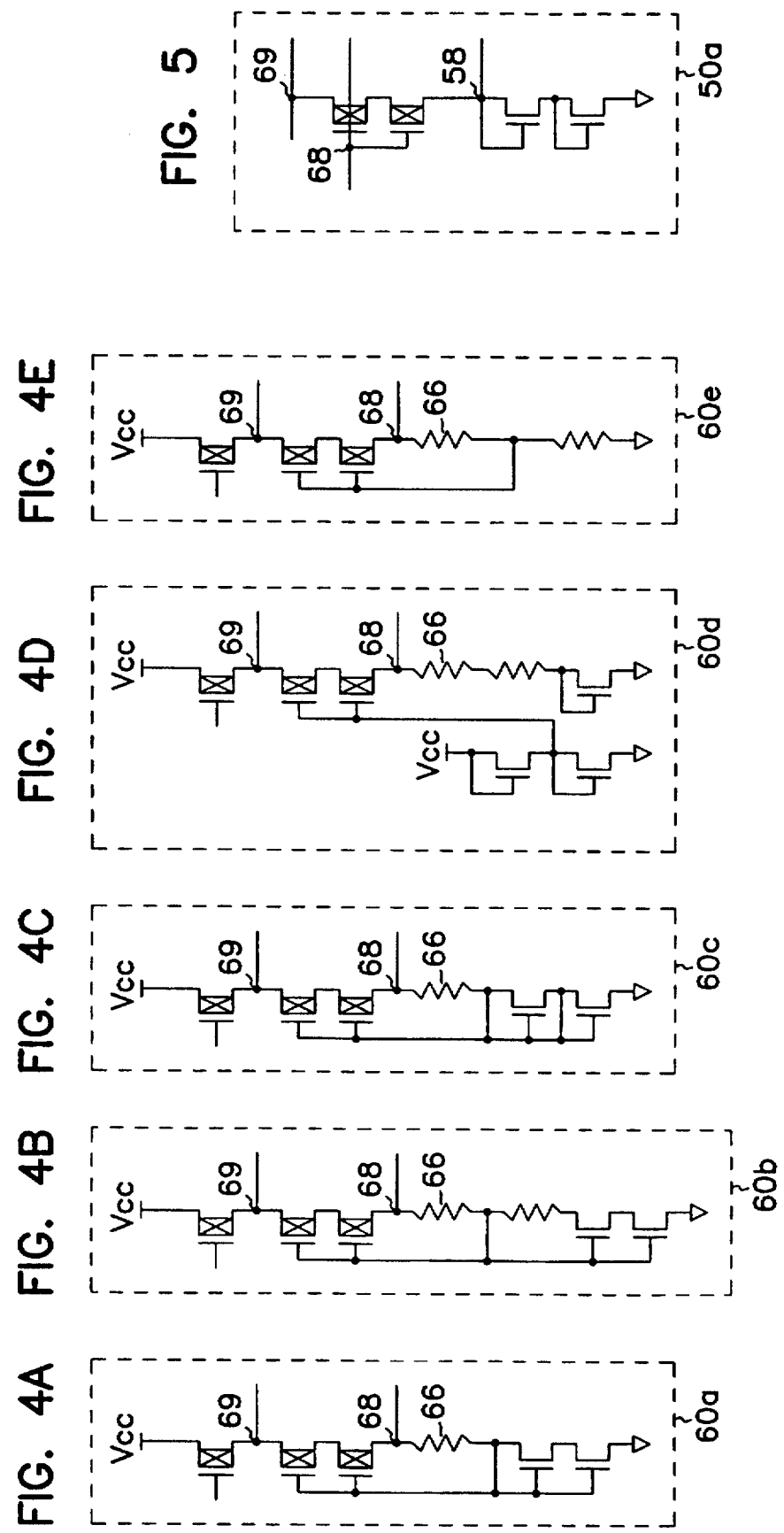

VOLTAGE AND TEMPERATURE COMPENSATED RING OSCILLATOR FOR A MEMORY DEVICE

This application is a continuation of U.S. patent application Ser. No. 08/634,269, filed on Apr. 18, 1996, now issued as U.S. Pat. No. 5,694,090.

THE FIELD OF THE INVENTION

The present invention relates generally to semiconductor integrated circuits, and particularly to a ring oscillator with voltage and temperature compensation.

BACKGROUND OF THE INVENTION

Most integrated circuits need a timing device, or timer, to initiate certain operations regularly. For example, an integrated circuit of a dynamic random access memory (DRAM) equipped with a self refresh needs a timer to initiate the refresh operation. This timer measures the time interval between refresh operations, or elapsed time, to regularly trigger the refresh operation. There are many different designs of timers, but generally a timer for a refresh operation of a DRAM is usually constructed using a ring oscillator. The ring oscillator is usually fabricated on the same integrated circuit within the DRAM.

A typical ring oscillator mainly comprises an odd number of inverter stages connecting serially in a ring fashion with the output of each inverter connected to the input of the succeeding inverter in the ring. The output of the last inverter is connected to the input of the first inverter to produce an oscillating signal or oscillation frequency.

Those familiar with designs fabricated on integrated circuits know that the speed at which these designs operate is influenced by changes in supply voltage and operating temperature. Specifically, these designs operate at a higher speed with increasing supply voltage and/or decreased temperature and at a lower speed at the opposite extremes. This is largely due the changes in transistor conductance over voltage and temperature.

The oscillation frequency of the ring oscillator is influenced by the changes in voltage and temperature. When the temperature increases and/or the supply voltage decreases, the effective carrier mobility in the channel of the transistors decreases, the transistors become less conductive, and the speed of the inverter stages is reduced, which consequently contributes to the decrease of the oscillation frequency. At the other extreme, when the temperature decreases and/or supply voltage increases, the transistors are more conductive and the speed of the inverter stages is faster; therefore the oscillation frequency is increased.

For the reasons stated above, there is a need for an improved ring oscillator with a frequency stabilizing circuit so that the frequency of the ring oscillator is stabilized when there is a change in voltage and temperature.

SUMMARY OF THE INVENTION

The present invention is a voltage and temperature compensated oscillator frequency stabilizer.

In particular, the present invention describes an integrated circuit comprising a ring oscillator having a capacitor coupled between a complementary-metal-oxide-semiconductor (CMOS) inverter and inverter stages connected serially in a ring for producing oscillating output having rising and falling transitions. The oscillation frequency of the ring oscillator is set by the combination of the R-C time constant of the capacitor and the speed of the inverter stages. The ring oscillator is coupled to a frequency stabilizing circuit through a current discharge path. The main characteristic of the frequency stabilizing circuit is using the varying transistor conductances to compensate the conductance of the current discharge path in order to stabilize the oscillation frequency.

In one preferred embodiment, the frequency stabilizing circuit comprises a control circuit having p-channel and n-channel control devices and a current mirror designed to control the discharge rate of the current from the ring oscillator capacitor. The control circuit receives compensated voltage control signals from the output of a compensating circuit to allow the control devices to control the discharge rate of the current by using a current mirror principle. The compensating circuit comprises a current regulator coupled in series with a resistive element and a current limiter. In one preferred embodiment, the current regulator comprises a field-effect transistor. In an alternative embodiment, the current regulator comprises two or more field-effect transistors coupled in series. In yet another alternative embodiment, the current regulator is coupled to at least one field-effect transistor. The resistive element comprises a resistor connected in series with the current limiter. In one preferred embodiment, the current limiter comprises a diode. In an alternative embodiment, the current limiter comprises at least two field-effect transistors coupled in series. And in yet another alternative embodiment, the current limiter comprises at least one field-effect transistors coupled in series with a resistor. And in yet another alternative embodiment, the current limiter comprises a resistor. The conductance ratio of the resistive element and the current regulator device determines the necessary compensated voltage signals provided to the control devices of the control circuit to control the amount of current flowing through the control circuit to compensate and stabilize the oscillation frequency. Furthermore, the output of the compensating circuit is only suitable for the p-channel control device, therefore an inverting circuit having a pullup device and a pulldown device is designed to provide a control signal for the n-channel control device. In one preferred embodiment, the pullup device comprises a field-effect transistor and the pulldown device comprises two diodes coupled in series. In an alternative embodiment, the pullup device comprises two or more field-effect transistors coupled in series.

Since the frequency stabilizing circuit attempts to slow the ring oscillator based on the same conductance which inherently causes the ring oscillator to speed up, therefore the result is similar to negative feedback and has a stabilizing effect on the oscillation frequency.

BRIEF DESCRIPTION OF THE DRAWINGS

FIG. 4A–4E are alternative embodiments of the compensating circuit within the frequency stabilizer circuit of FIG. 2.

FIG. 5 is an alternative embodiment of an inverting circuit within the frequency stabilizer circuit of FIG. 2.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is therefore, not to be taken in limiting sense, and the scope of the invention is defined by the appended claims.

Figure 1:
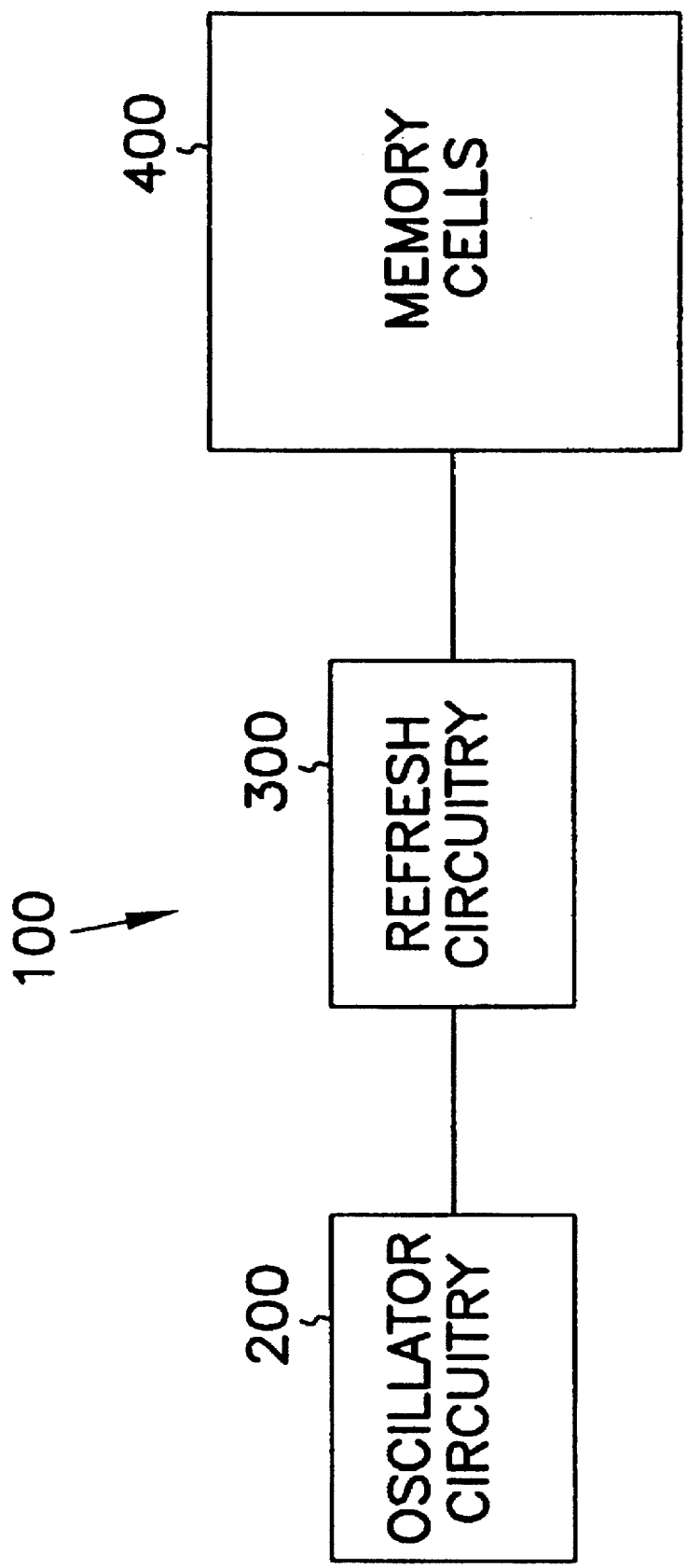
FIG. 1 is a block diagram of a memory device incorporating the present invention.

FIG. 1 is a block diagram of a memory device comprising a voltage and temperature compensated oscillator frequency stabilizer indicated in the drawings as oscillator circuitry 200, a refresh circuitry 300 and memory cells 400. Oscillator circuitry 200 comprises a ring oscillator and a frequency stabilizing circuit which stabilizes oscillation frequency of the oscillator in response to the variations of supply voltage and temperature. Oscillator circuitry 200 functions as a timing device to provide timing signal to refresh circuitry 300 so that memory cells 400 can be refreshed periodically.

Figure 2:
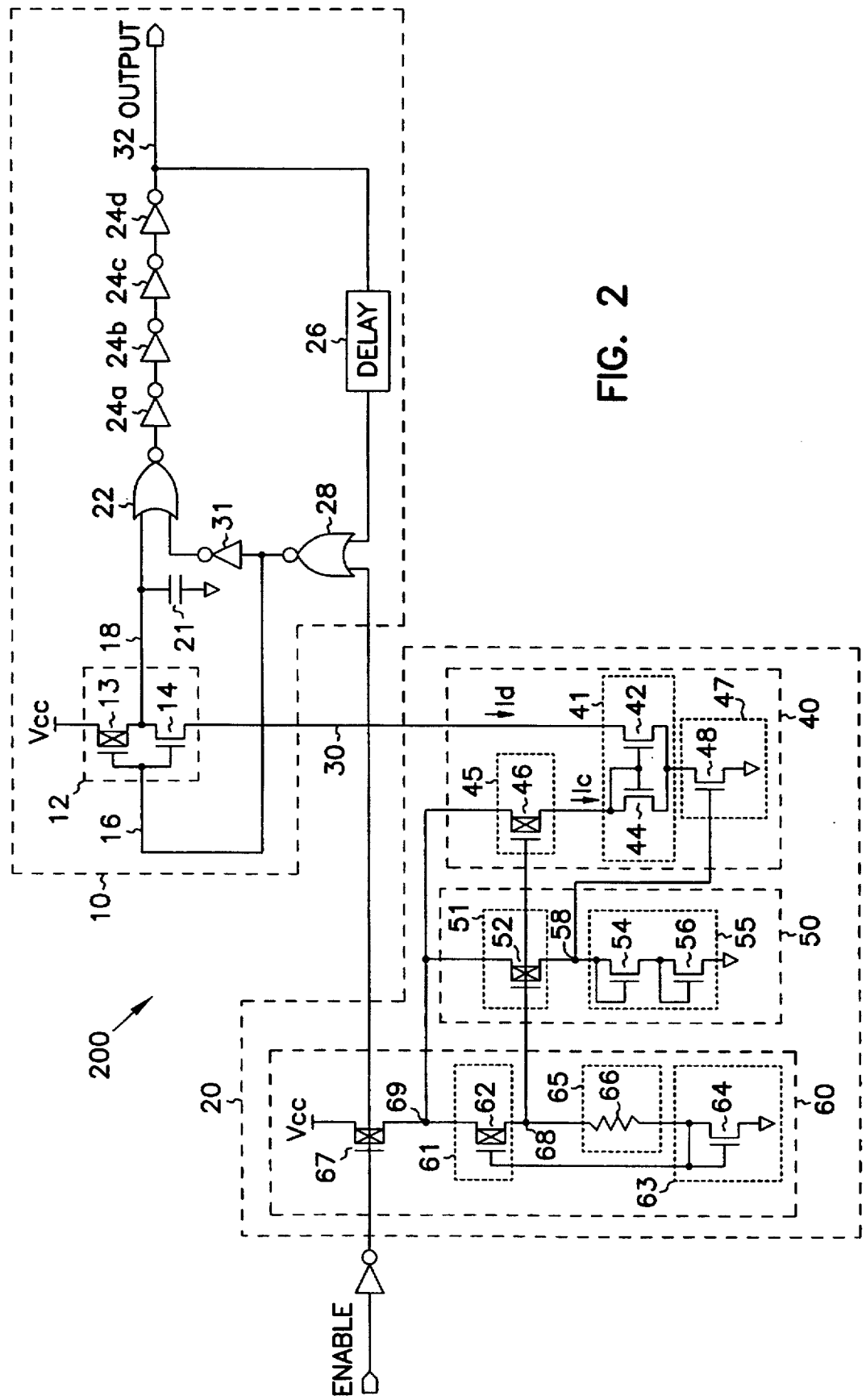
FIG. 2 is a schematic diagram of the voltage and temperature compensated oscillator frequency stabilizer according to the invention.

FIG. 2 is a schematic representation of a voltage and temperature compensated oscillator frequency stabilizer 200 which comprises ring oscillator 10 and frequency stabilizing circuit 20.

Ring oscillator 10 comprises a CMOS inverter 12 having an input 16 and an output 18. Inverter 12 comprises a p-channel transistor 13 having its source coupled to a supply voltage Vcc and an n-channel transistor 14 with its source coupled to a discharge path 30. Transistors 13 and 14 have their gates coupled to input 16 and their drains coupled to output 18. CMOS inverter 12 operates as a switch to control the charging and discharging cycles of capacitor 21.

Ring oscillator 10 further comprises a capacitor 21 coupled between output 18 and a ground. A NOR gate 22 has its first input coupled to capacitor 21 and its output coupled to serially-connected invertors 24a–24d. The output of inverter 24d is coupled to the ring oscillator output 32. The second input of NOR gate 22 is coupled to the output of a inverter 31 whose input is coupled to the output of a NOR gate 28 and input 16. A delay 26 is coupled between the first input of NOR gate 28 and the ring oscillator output 32. NOR gate 28 operates as a switch to alter the state of the CMOS switch so that capacitor 21 can repeat the charging and discharging cycles to produce oscillating signal at the output of the ring oscillator.

Frequency stabilizing circuit 20 comprises a control circuit 40, an inverting circuit 50 and a compensating circuit 60. Control circuit 40 is coupled to ring oscillator 10 through a current discharge path 30. Inverting circuit 50 has an output 58 and compensating circuit 60 has an output 68.

Control circuit 40 is designed to modify the conductances of its control devices to compensate the rate of the discharged current flowing through discharge path 30 in order to stabilize the oscillation frequency. Control circuit 40 comprises a p-channel control device 45 and an n-channel control device 47 and a current mirror 41. Current mirror 41 comprises n-channel transistors 42 and 44 having their gates and sources coupled together and arranged in a position such that the current flowing through the drains of the transistors are substantially the same. P-channel control device 45 comprises a p-channel transistor 46, and n-channel control device 47 comprises an n-channel transistor 48. P-channel transistor 46 has its drain coupled to the gate and the drain of n-channel transistor 44, and the gate of n-channel transistor 42, its source coupled to node 69 and its gate coupled to output 68 of compensating circuit 60. N-channel transistor 48 has its drain coupled to the sources of n-channel transistors 42 and 44, its source coupled to a ground and its gate coupled to output 58 of inverting circuit 50. Control circuit 40 is coupled to ring oscillator 10 at the drain of n-channel transistor 42 via discharge path 30.

Inverting circuit 50 is designed to invert the voltage signal from the output of compensating circuit 60 to provide a voltage signal to n-channel control device 47 of control circuit 40. Inverting circuit 50 comprises a pullup device 51 and a pulldown device 55. Pullup device 51 comprises a p-channel transistor 52, and pulldown device 55 comprises a pair of n-channel transistors 54 and 56 connecting serially as two diodes. P-channel transistor 52 has its source coupled to node 69, its gate coupled to output 68 of compensating circuit 60 and its drain coupled to output 58 which is also the input of diodes 54 and 56. The output of the diodes is coupled to a ground.

Compensating circuit 60 is designed to provide compensated voltage signal to p-channel control device 45 and to inverting circuit 50 which provides voltage signal to n-channel control device 48. Compensating circuit 60 comprises a current regulator 61, a resistive element 65, and a current limiter 63. Current regulator 61 comprises a p-channel transistor 62. Resistive element 65 comprises a resistor 66. And current limiter 63 comprises an n-channel transistor 64 functioning as a diode. Transistor 62 has its gate coupled to the gate and the drain of n-channel transistor 64 whose source is coupled to a ground. Resistor 66 is coupled between the drain of n-channel transistor 64 and the drain of p-channel 62 which is also the output 68 of compensating circuit 60.

Compensating circuit 60 further comprises a p-channel transistor 67 having its source coupled to supply voltage Vcc and its drain coupled to the sources of p-channel transistors 62, 52 and 46 at node 69. The gate of p-channel transistor 67 is coupled to the inverse of an Enable signal which also provides a signal to the second input of NOR gate 28 of ring oscillator 10.

Control circuit 40 is designed to compensate the rate of the discharge current of capacitor 21 of ring oscillator 10. Compensating circuit 60 is designed to provide compensated voltages to modify the conductances of the p-channel and the n-channel control devices of control circuit 40. Since the output of compensating circuit 60 is only suitable for the p-channel control device, therefore inverting circuit 50 is designed to provide a similar compensated voltage for the n-channel control device of control circuit 40.

In operation, referring to FIG. 2, when the Enable signal is low which makes the output of NOR gate 28 low causing n-channel transistor 14 off and p-channel transistor 13 on, therefore capacitor 21 is charged. In this case, the output of NOR gate 22 is low, consequently ring oscillator output 32 remains low and has no oscillating signal.

When the Enable signal goes from low to high causing the output of NOR gate 28 and input 16 high which turns p-channel transistor 13 off and n-channel transistor 14 on. At this point, capacitor 21 begins to discharge through n-channel transistor 14 and the discharge current, indicated by Id, flows down to discharge path 30. When capacitor 21 is discharged, both inputs of NOR gate 22 are low which make its output high. This high signal propagates through invertors 24a–24d to output 32 and delay 26 and then comes back to the first input of NOR gate 28. This high level on the first input of NOR gate 28 forces its output low and consequently turns n-channel transistor 14 off and p-channel transistor 13 on and capacitor 21 stops discharging and starts a charging cycle. The low output on node 16 propagates through inverter 31 as a high input to NOR gate 22. This forces the output of NOR gate 22 low which propagates through inverters 24a–d to delay 26. Sufficient time for capacitor 21 to fully charge is provided by the slow propagation of this low signal through delay 26. As long as the Enable signal remains high, capacitor 21 repeats the process of charging and discharging resulting in output 32 producing an oscillation signal or oscillation frequency.

The oscillation frequency is determined by the combination of the R-C time constant of capacitor 21 discharging through n-channel transistors 14, 42 and 48, and the speed of inverter stages of ring oscillator 10. As previously discussed, the oscillation frequency is effected by the changes in voltage and temperature.

In the case when temperature increases and/or voltage decreases, the speed of the ring oscillator 10 slows down resulting in the decrease of the oscillation frequency. In this case, frequency stabilizing circuit 20 forces discharge path 30 to be more conductive thus allowing more current flowing through and consequently speeds up ring oscillator 10 to compensate the decrease in speed and therefore the oscillation frequency is stabilized.

In the other case when temperature decreases and/or voltage increases, the speed of the ring oscillator 10 increases resulting in the increase of the oscillation frequency. In this case, frequency stabilizing circuit 20 forces discharge path 30 to be less conductive thus allowing less current flowing through and consequently slows down ring oscillator 10 to compensate the increase in speed and therefore the oscillation frequency is stabilized.

Since the rate of discharge current Id is a primary factor in determining the oscillation frequency, therefore, if the variation of the rate of discharge current Id can properly be monitored and compensated then the variation of the oscillation frequency can also be compensated and stabilized. Based on the principle of the current mirror, discharge current Id is dependent on a control current indicated by Ic of the current mirror formed by n-channel transistors 42 and 44. Current Ic is controlled by p-channel transistor 46 and n-channel transistor 48 whose conductances are controlled by compensated voltage signals of inverting circuit 50 and compensating circuit 60. Therefore if Ic is properly compensated then current Id is also compensated and the oscillation frequency is stabilized.

Compensating circuit 60 provides the compensated voltage to circuit 40 from its output 68 by using the conductance ratio of resistor 66 and p-channel transistor 62. N-channel transistor 64 is connected as a low conductivity diode to allow a drop in the total voltage and limiting the current consumption of compensating circuit 60. The voltage drop by n-channel transistor 64 biases up the control voltage at output 68 to a range near Vcc. P-channel transistor 62 and resistor 66 drop the remaining voltage in a ratio dependent on the conductance of p-channel transistor 62. Resistor 66 experiences only second order effects from changes in voltage and temperature and therefore is somewhat constant. As the temperature decreases and/or the voltage increases, p-channel transistor 62 becomes more conductive and drops less of the voltage of compensating circuit 60 causing output 68 to be closer to Vcc. Conversely, as the temperature increases and/or voltage decreases, p-channel transistor 62 becomes less conductive and drops more voltage causing output 68 to be further from Vcc.

Figure 3:
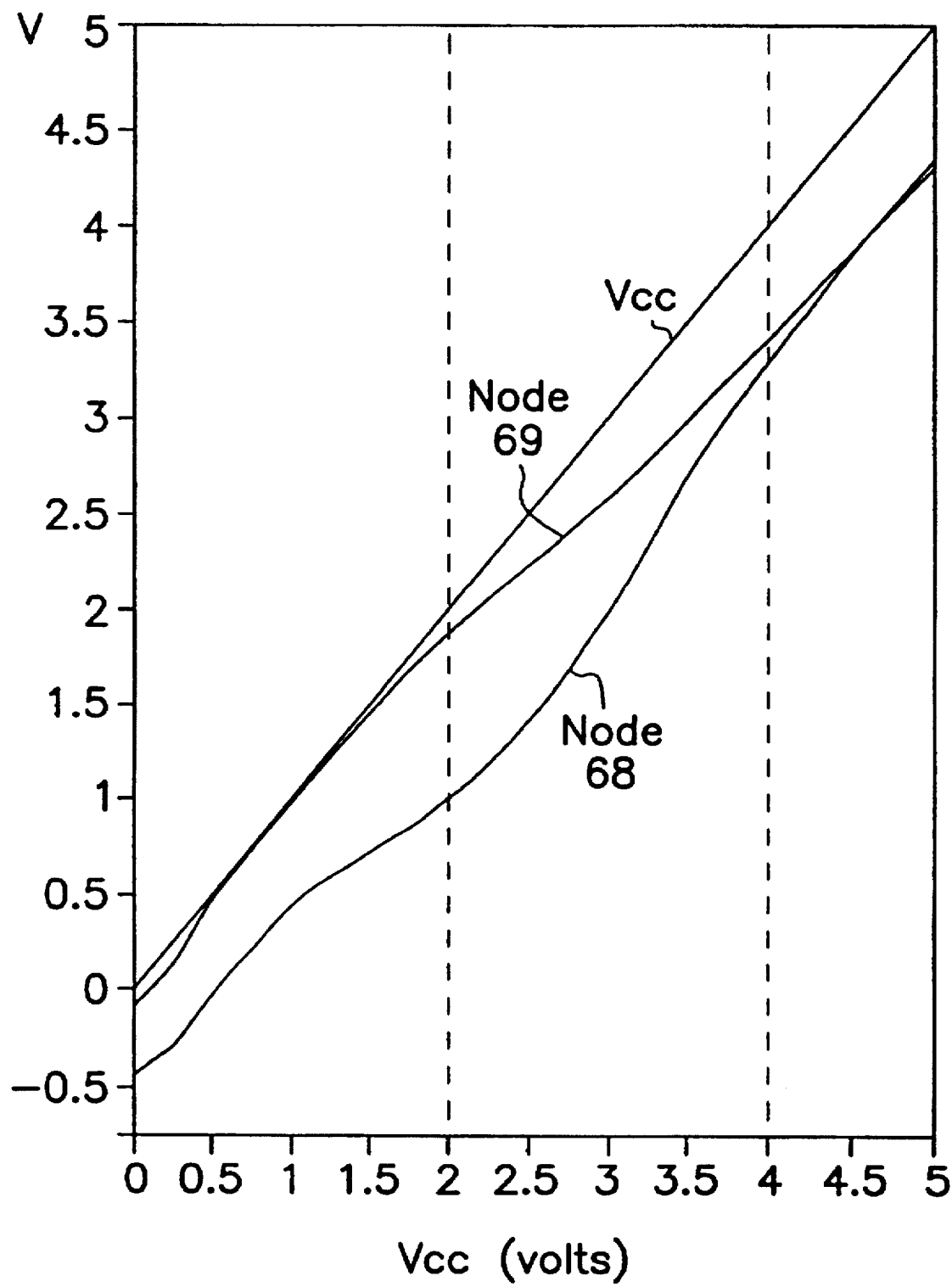
FIG. 3 is a graph illustrating the nodal voltage signals of a compensating circuit within the frequency stabilizer circuit of FIG. 2.

Referring to FIG. 3, as Vcc increases approximately from 2 to 4 volts, the gap or the difference between the voltage at node 69 and the voltage of output 68 becomes smaller. This differential voltage, between node 69 and node 68, is also the voltage gate-to-source, Vgs, of p-channel transistors 52 and 46. As Vcc increases, Vgs decreases, p-channel transistors 52 and 46 become less conductive and allow less current flowing. In the opposite, when Vcc decreases Vgs of p-channel transistors 52 and 46 increases allowing more current flowing.

When temperature decreases and/or supply voltage Vcc increases, Vgs decreases and p-channel transistor 52 becomes less conductive causing the pullup and pulldown ratio of p-channel transistor 52 and n-channel transistors 54 and 56 to favor the pulldown, forcing output 58 to a lower voltage or nearer to ground potential. Conversely, when temperature increases and/or Vcc decreases the voltage of output 58 increases. Since output 58 provides a control signal to the gate of n-channel transistor 48, therefore, the variation of Vgs of n-channel transistor 48 is proportional to the variation of the voltage of output 58. And thus, the conductance of n-channel transistor 48 is modified by output 58 to regulate and compensate the flow of current in proportion to the changes of voltage and temperature.

From the above discussion, the flow or the rate of the current Ic can be controlled and compensated by p-channel transistor 46 and n-channel transistor 48 using the compensated voltage signals of compensating circuit 60 and inverting circuit 50. Therefore, discharge current Id of capacitor 21 and consequently the oscillation frequency is compensated by compensating signals using the varying transistor conductances of the transistors of frequency stabilizing circuit 20.

FIGS. 4A–4E are alternative embodiments of compensating circuit 60 of frequency stabilizing circuit 20 of FIG. 2. Compensating circuits 60a–60e can be used as substitutes for compensating circuit 60 of FIG. 2 without departing from the scope and characteristic of the present invention.

Note also that in circuits 60 and 60a–60e, the amount of compensation can be adjusted by tapping output 68 at various points along resistor 66 with the greatest compensation being realized with output 68 connected as shown.

FIG. 5 is an alternative embodiment of inverting circuit 50 of frequency stabilizing circuit 20 of FIG. 2. Inverting circuit 50a can be used to replace inverting circuit 50 of FIG. 2 without departing from the scope and characteristic of the present invention.

It should be noted that in many field-effect transistors, the source and drain are essentially interchangeable, and interconnections specified herein should not be interpreted as solely limited to those described. In addition, certain transistors were described as n-channel or p-channel transistors. It is recognized by those skilled in the art that such transistors may be switched on essentially a wholesale basis so that those described as p-channel become n-channel and those described as n-channel become p-channel transistors. Also, the compensating circuit, the inverting circuit and the control circuit described hereinabove could be constructed using other integrated circuit technology such as bipolar technology without departing from the scope and spirit of the present invention.

It is to be understood that the above description is intended to be illustrative, and not restrictive. Many other embodiments will be apparent to those of skill in the art upon reviewing the above description. The scope of the invention should, therefore, be determined with reference to appended claims, along with the full scope of equivalents to which such claims are entitled.

What is claimed is:

1. A memory device comprising:

a plurality of memory cells;

a ring oscillator for producing an output signal having rising and falling transitions; and a frequency stabilizing circuit coupled to the ring oscillator for compensating and stabilizing an oscillation frequency of the ring oscillator in response to voltage and temperature variations, wherein the frequency stabilizing circuit comprises:

a compensating circuit including a resistive element coupled to a current regulator to provide a variable conductive ratio based on the conductivity of the current regulator to provide a first variable voltage signal at an output of the compensating circuit;

an inverting circuit including a pull-up device and a pull-down device coupled to the compensating circuit for inverting the first variable voltage signal from the output of the compensating circuit to produce a second variable voltage signal at an output of the inverting circuit; and a control circuit including control devices coupled to receive the first and the second variable voltage signals to modify conductivity of the control devices to control a current of the ring oscillator.

2. The memory device of claim 1 further comprising a refresh circuit coupled to the ring oscillator for controlling a refresh period of the plurality of memory cells.

3. The memory device of claim 1 wherein the ring oscillator comprises a capacitor which can be selectively discharged through the control circuit.

4. The memory device of claim 1 wherein the compensating circuit comprises:

a resistor coupled to a ground connection via a current limiter circuit; and a current regulator circuit coupled to the resistor and a supply voltage connection.

5. The memory device of claim 4 wherein the current limiter circuit comprises a plurality of series connected transistors.

6. The memory device of claim 5 wherein at least one of the plurality of series connected transistors is connected as a diode.

7. The memory device of claim 4 wherein the compensating circuit comprises a plurality of series connected resistors.

8. The memory device of claim 4 wherein the current limiter circuit comprises a resistor.

9. The memory device of claim 4 wherein the current regulator circuit comprises a plurality of series connected transistors.

10. A memory device comprising:

a plurality of memory cells;

a ring oscillator for producing an output signal having rising and falling transitions; and a frequency stabilizing circuit coupled to the ring oscillator for producing variable voltage signals to control and stabilize the oscillation frequency of the ring oscillator, wherein the frequency stabilizing circuit comprises:

a compensating circuit coupled between a first reference voltage and a second reference voltage to provide a first variable voltage signal directly proportional to a change in the first reference voltage;

an inverting circuit for inverting the first variable voltage to produce a second variable voltage signal; and a control circuit coupled to the compensating circuit and the inverting circuit for controlling the rate of a discharge current from the ring oscillator.

11. The memory device of claim 10 further comprising a refresh circuit coupled to the plurality of memory cells for refreshing the memory cells and coupled to the ring oscillator for controlling a refresh period of the plurality of memory cells.

12. The memory device of claim 10 wherein the ring oscillator comprises a capacitor which can be selectively discharged through the control circuit.

13. A method of refreshing a memory device, comprising:

producing an oscillating signal using a ring oscillator circuit coupled to a refresh circuit;

modifying a conductance of a discharge current path to regulate a discharge rate of a capacitor in the ring oscillator, wherein the conductance of the discharge current path is inversely proportional to a change in supply voltage.

* * * * *